United States Patent [19]
Tokumaru

[11] Patent Number: 5,369,596
[45] Date of Patent: Nov. 29, 1994

[54] SEMICONDUCTOR INTEGRATED CIRCUIT FABRICATION METHOD

[75] Inventor: Takeji Tokumaru, Kitagami, Japan

[73] Assignee: Kabushiki Kaisha Toshiba, Kawasaki, Japan

[21] Appl. No.: 795,533

[22] Filed: Nov. 21, 1991

[30] Foreign Application Priority Data

Nov. 22, 1990 [JP] Japan .................. 2-315895

[51] Int. Cl.⁵ .............................. G06F 15/60
[52] U.S. Cl. .................... 364/491; 364/488; 364/489; 364/490
[58] Field of Search ............... 364/488–491; 307/200.1, 440, 465.1, 303.1

[56] References Cited

U.S. PATENT DOCUMENTS

| | | | |
|---|---|---|---|
| 3,772,536 | 11/1973 | Grannis et al. | 307/304 |
| 4,377,849 | 3/1983 | Finger et al. | 364/491 |
| 4,484,292 | 11/1984 | Hong et al. | 364/491 |
| 4,580,228 | 4/1986 | Noto | 364/491 |
| 4,584,653 | 4/1986 | Chih et al. | 364/491 |
| 4,613,940 | 9/1986 | Shenton et al. | 364/490 |
| 5,097,422 | 3/1992 | Corbin, II et al. | 364/491 |
| 5,212,653 | 5/1993 | Tanaka | 364/491 |
| 5,231,590 | 6/1993 | Kumar et al. | 364/491 |

OTHER PUBLICATIONS

Kessler et al., "Standard Cell VLSI Design: A Tutorial," Jan. 1985, *IEEE Circuits and Devices Magazine*, pp. 17–33.

*Primary Examiner*—Thomas G. Black
*Assistant Examiner*—Leigh Marie Garbowski
*Attorney, Agent, or Firm*—Foley & Lardner

[57] ABSTRACT

A semiconductor integrated circuit fabrication method for designing and fabricating semiconductor circuit elements on a semiconductor substrate for a LSI, which comprises the steps of: drawing a semiconductor circuit diagram by arranging standard cells for the semiconductor circuit elements and wiring among the standard cells by using a standard cell design method; describing circuit description net statements based on the semiconductor circuit diagram; arranging and wiring the standard cells to one another; converting the standard cells into symbolic cells with a one-to-one correspondence to generate a symbolic cell layout; generating a stick diagram in accordance with the symbolic cell layout; changing the dimensions of each transistor in the symbolic cell, overlapping contact areas, vias among them, and wires between adjacent transistors in the symbolic cells as a common area, where possible, shortening the length of wire in the transistor, and changing the sliding of the contact area, the vias, and the wire of the transistor to obtain the minimum area for the transistor; forming a mask pattern in accordance with the arranging and wiring of the symbolic cells obtained by the above steps; and forming the semiconductor circuit elements and wiring among the semiconductor circuit elements on the semiconductor substrate by using the mask pattern.

1 Claim, 8 Drawing Sheets

STICK DIAGRAM

ACTUAL PATTERN LAYOUT

CIRCUIT DIAGRAM

FIG.5

CIRCUIT DESCRIPTION STATEMENTS

```
"*****************************"
"*         THIS TDL IS CREATED BY LOGICIAN       *"
"*              TNET (Version 5.10)              *"
"*                                               *"
"*****************************"
COMPILE ;
DIRECTORY  : MASTER ;
OPTIONS    : REPLACE, XREF ;
"************** FULADD **********
              *********"
MODULE     : FULADD///NET ;
INPUTS     :
             AI, BI, CI ;
OUTPUTS    :
             DI, SI ;
DESCRIPTION : THIS IS THE MODULE FOR /NET/APL2/USER/T9427/
              KUSAKA/FULADD  24-JAN-1990 15:05 ;
LEVEL      : CHIP
USE        :
             AN2 ///
           , NR2 ///
           , NR3 ///
           , OR3 ///
           , AN3 ///
           , TRIBUS ( +TRISTATE +SETZZ ) ;
WIRED DEFAULT TRIBUS ;
DEFINE :
         01N19 ( S1N32 ) = AN2 ( AI, CI ) ;
         01N20 ( S1N34 ) = AN2 ( BI, CI ) ;
         01N21 ( DI )    = AN2 ( S1N35, S1N36 ) ;
         01N22 ( SI )    = NR2 ( DI, S1N39 ) ;
         01N23 ( S1N35 ) = NR3 ( S1N31, S1N32, S1N34 ) ;
         01N24 ( S1N36 ) = OR3 ( AI, BI, CI ) ;
         01N31 ( S1N39 ) = AN3 ( AI, BI, CI ) ;
         01N32 ( S1N31 ) = AN2 ( AI, BI ) ;
END     : MODULE ;
END     : COMPILE ;
END     : TDL ;
```

OPTIMUM PATTERN
LAYOUT

EXAMPLE OF DIFFUSION CONTACTS OF ADJACENT INVERTER TRANSISTORS WHICH ARE NOT OVERLAPPED

DIFFUSION CONTACT

DIFFUSION CONTACT

EXAMPLE OF OPTIMUM DIFFUSION CONTACTS OF ADJACENT INVERTER TRANSISTORS WHICH ARE OVERLAPPED

OVERLAPPED DIFFUSION CONTACT BETWEEN ADJACENT INVERTERS

SEMICONDUCTOR INTEGRATED CIRCUIT FABRICATION METHOD

BACKGROUND OF THE INVENTION

1. Field of the invention

This invention relates generally to a semiconductor integrated circuit fabrication method and, more particularly to a semiconductor integrated circuit fabrication method by which a semiconductor integrated circuit with a high degree of integration almost equal to that of a semiconductor integrated circuit fabricated by using a manual design method can be designed, and with a design time and design labor by a designer equal to those required for a semiconductor integrated circuit obtained by using a standard cell design method.

2. Description of the Prior Art

Conventionally, there are three methods for the design of large scale integrated (LSI) circuits. The first method is called a full-custom design method in which transistors and other circuit elements are designed on a semiconductor substrate for every LSI design. By this method a physical mask layout with a very small area can be designed for a LSI with a high performance. However, with this design method much time is required to design the LSI. This is a problem.

The second design method is called a gate array design method in which many transistor elements and the like are preliminarily formed in a matrix on a semiconductor substrate as a wafer. In this case, various block functions have already been designed and registered in a library as basic cells each having a predetermined configuration. A designer combines the basic cells and designs only the wiring among the basic cells while referring to the basic cells in the library, then exposes the basic cells on the actual wafer through a mask to obtain a required chip. By using the gate array design method, a designer can design an LSI having a required function in a short time.

The third design method is called a standard design method, and is midway between the full-custom design method and the gate array design method in design time and cost. In this case, an optimum arrangement of elements such as transistors and wiring has already been determined in a cell. A designer combines cells to obtain a LSI with a required function while referring to the cells stored in a library. A designer can design an LSI using the standard cell method faster than by the full-custom method. However, in this case, a wafer for each LSI must be formed because the cell arrangement on a semiconductor substrate is different for each LSI design. The standard cell method takes much time as compared to the gate array method. However, the standard cell method is commonly used as the most simple and convenient method.

Recently, a combination of the three design methods described above has been widely used for design of a LSI. For example, one part of a chip is designed using the full-custom design method, and another part in the same chip using the standard cell design method. This combination design method can be used to efficiently design an LSI.

Generally, a pattern in a cell cannot be changed when the cell is arranged and wired to other cells in the standard cell design method. Therefore when many cells are arranged to form a circuit having a required function, the same pattern is formed between adjacent cells. On the other hand, when the full-custom design method is used, the pattern between adjacent cells is not the same. This way, the degree of integration in a chip can be decreased when the standard cell design method is applied to a design for a LSI because there are many dead areas in the chip.

In addition, the conventional standard cells are designed with the idea that only standard cells are arranged on a chip. For example, the lead of a standard cell is changed by the amount of fan-in or fan-out. However, in general, the dimensions of an output driver for each standard cell are designed larger because various combinations of the standard cells are used for an LSI design. The gate length for each transistor in a LSI designed by the standard cell design method is large. However, a designer can easily design an LSI by using the standard cell design method.

For example, one half portion of a chip is designed by the standard cell design method. A maximum total wiring length among the standard cells in the half portion is the same as half of the total wiring length obtained when all chips are designed by the standard cell design method. In addition, the lead on the half portion is the same as half the total lead of the chip. In this case, the quality of the standard cells in the half portion exceeds the required quality level. These standard cells have over quality. This problem is also caused when the standard cells are used in different sized chips.

SUMMARY OF THE INVENTION

An object of the present invention is to solve this problem of the prior art described above by providing a semiconductor integrated circuit fabrication method. A designer can design any LSI by using the method of the present invention. The fabrication time and labor to fabricate the LSI are equal to those requirements for a standard cell design method and the degree of integration is equal to that obtained by the full-custom design method as a manual design.

A semiconductor integrated circuit fabrication method for designing and fabricating semiconductor circuit elements on a semiconductor substrate for a LSI, according to the present invention, comprises the steps of:

drawing a semiconductor circuit diagram by arranging standard cells for the semiconductor circuit elements and wiring among the standard cells by using a standard cell design method;

describing circuit description net statements based on the semiconductor circuit diagram;

arranging and wiring the standard cells to one another;

converting the standard cells into symbolic cells with a one-to-one correspondence to generate a symbolic cell layout;

generating a stick diagram in accordance with the symbolic cell layout;

changing the dimensions of each transistor in the symbolic cell, overlapping contact areas, vias among them, and wires between adjacent transistors in the symbolic cells as a common area, where possible, shortening the length of wire in the transistor, and changing sliding of the contact area, the vias, and the wire of the transistor to obtain the minimum area for the transistor;

forming a mask pattern in accordance with tile arranging and wiring of the symbolic cells obtained by the above steps; and forming the semiconductor circuit elements and wiring among the semiconductor circuit elements on the semiconductor substrate by using the mask pattern.

The degree of integration of a LSI can be increased by using the semiconductor integrated circuit fabrication method because the common area between adjacent symbolic cells is overlapped. In addition, more suitable dimensions for the semiconductor circuit elements on the semiconductor substrate can be obtained.

BRIEF DESCRIPTION OF THE DRAWING

FIG. 5 is a circuit description net statement for the circuit shown in FIG. 4;

DETAILED DESCRIPTION OF THE EMBODIMENT

Figure 1:
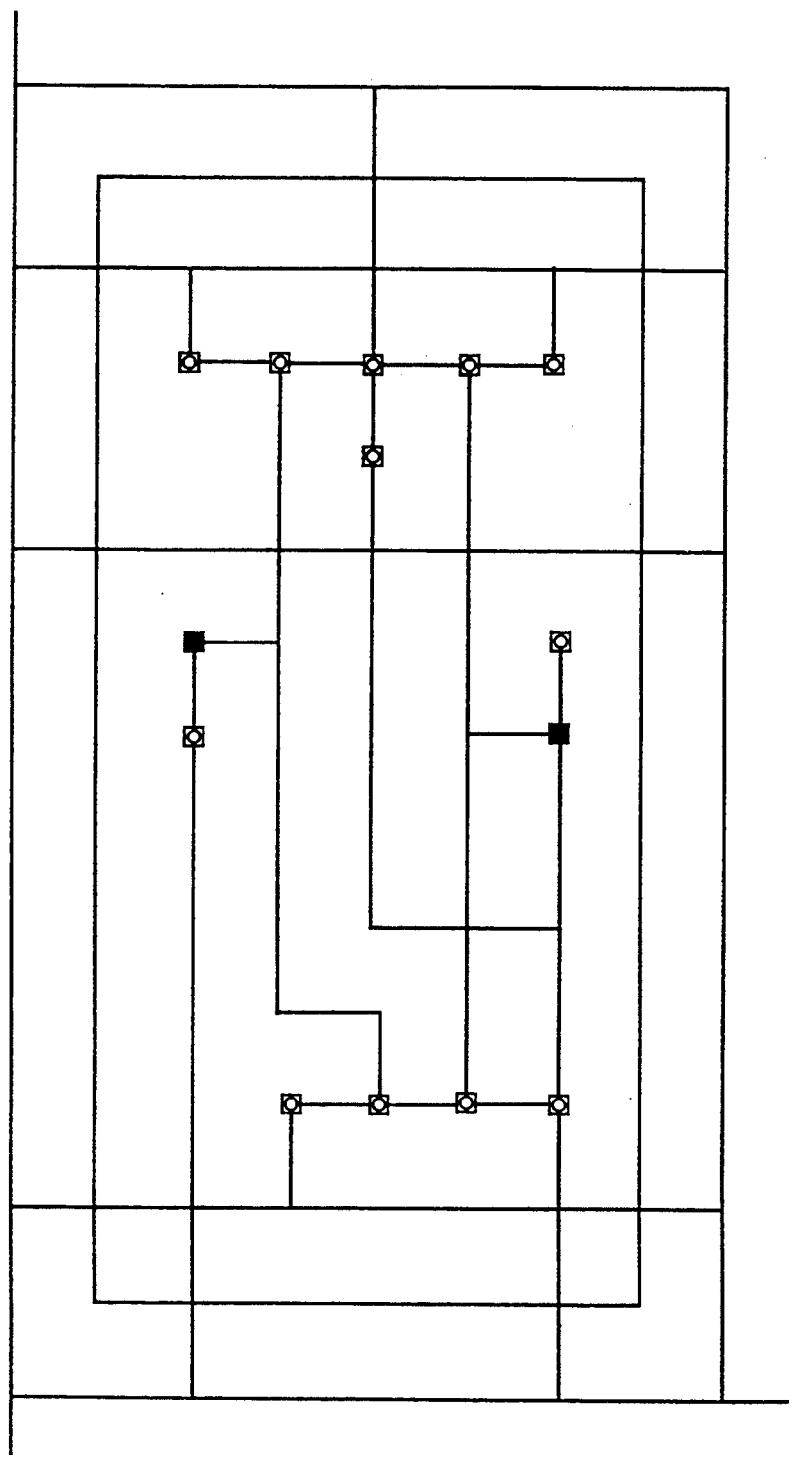
FIG. 1 is a stick diagram as a symbolic layout for a 2 input NAND gate, which is conventionally used.

The preferred embodiment according to the present invention will now be explained referring to the drawings.

Recently, a symbolic cell design method has been suggested as a new design method, as an extension of the standard cell design method. The symbolic cell is defined as a symbolic representation of various circuit elements such as transistors, contacts, capacitors, terminals, and the like. These symbols are connected to one another by using wires called as sticks having no width in the symbolic layout and registered as a stick diagram. Constituent elements of the stick diagram are N channel type Field Effect Transistors (FETs), P channel type FETs, N channel type diffusion layer wires, P channel type diffusion layer wires, power source lines, contacts, and the like.

The relative position between -the symbol and the wire corresponds to that in a mask layout.

FIG. 1 is a stick diagram as a stick diagram for a NAND gate with two inputs.

Figure 2:
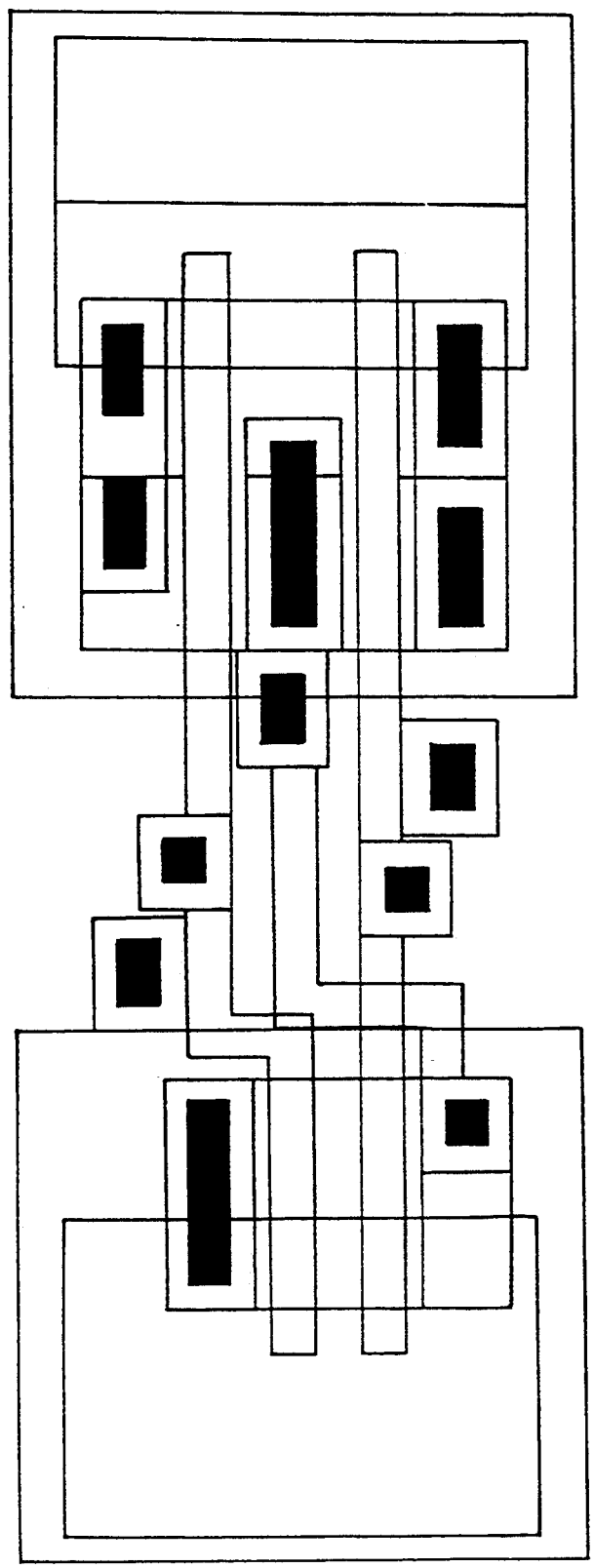
FIG. 2 is an actual pattern layout generated by using the stick diagram as the symbolic layout, as shown in FIG. 1.

FIG. 2 is an actual pattern generated by the stick diagram shown in FIG. 1.

In these diagrams, the symbolic cells described in the stick diagram are data that is converted to physical masks, layouts, and patterns by a computer. One of the features of the symbolic cells described in a stick diagram is as follows. The shape of a circuit cell represented by a symbolic cell can be changed easily according to the end use when the stick diagram is processed by a computer. In other words, a designer is enabled to repeatedly modify a stick diagram until a satisfactory result is obtained. For example, when diffusion contacts in adjacent inverter cells are used in common, the areas of the diffusion contacts can be overlapped as a common diffusion contact area for the adjacent inverters. Further, in the symbolic cell design method symbolic cells in a row need not be arranged at the same height. Accordingly, a physical mask layout with a minimum possible chip area is obtained automatically by the symbolic cell design method. Thus symbolic cells representing circuit elements in a stick diagram are drawn through a computer-aided graphics system.

Next, a compaction operation to obtain a minimum mask layout is performed by using a suitable program. A designer can select suitable parameters to obtain transistors and the like having satisfactory shapes as circuit elements for a LSI in the compaction operation.

In this embodiment of the semiconductor integrated circuit fabrication method according to the present invention, the integrated circuit is fabricated by the following design and fabrication steps.

Figure 3:
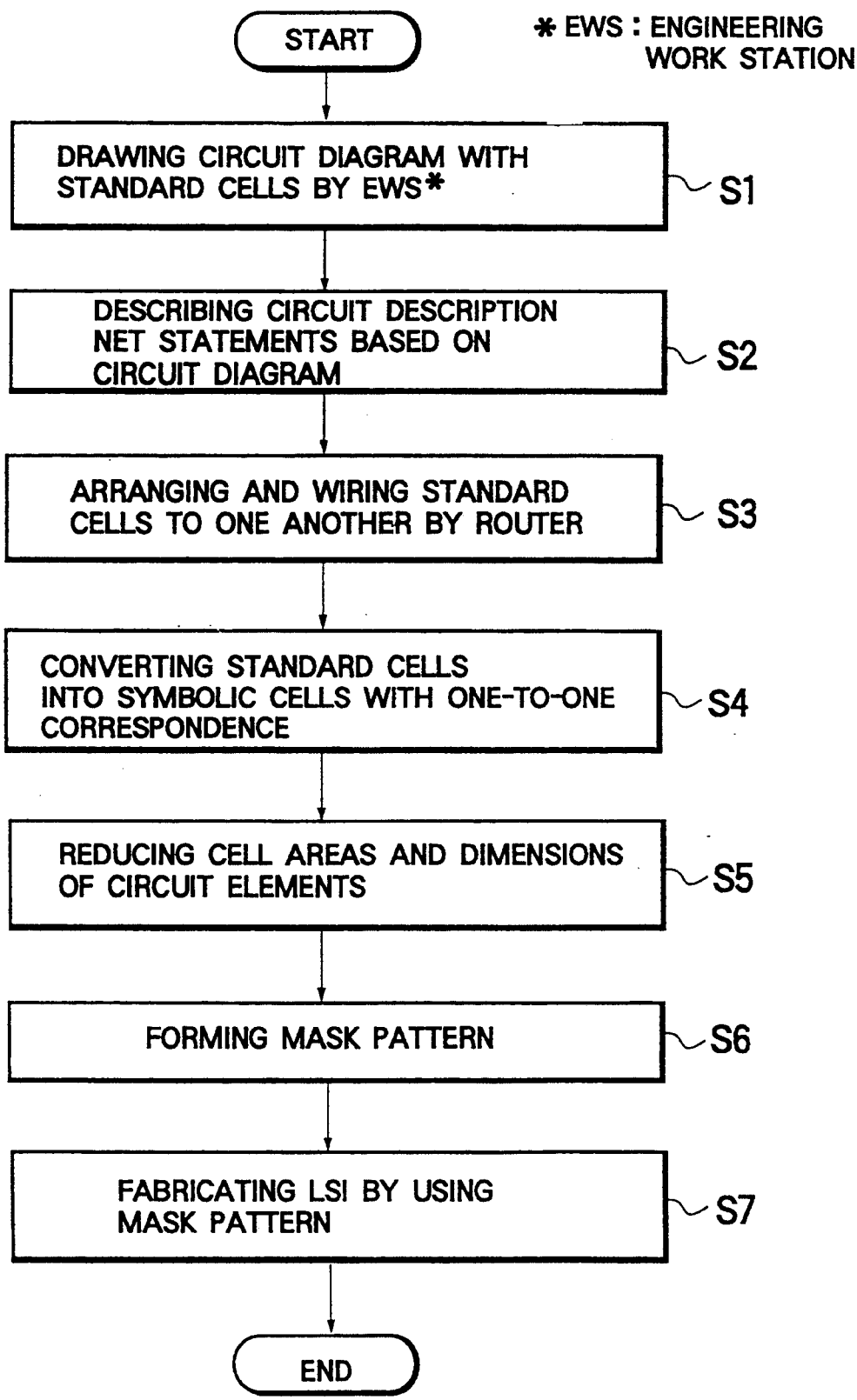
FIG. 3 is a flow chart showing design and fabrication steps for design and fabrication processes used in the semiconductor integrated circuit fabrication method according to the present invention.

FIG. 3 is a flow chart showing design and fabrication steps for a LSI according to the feature of the embodiment of the present invention.

Figure 4:
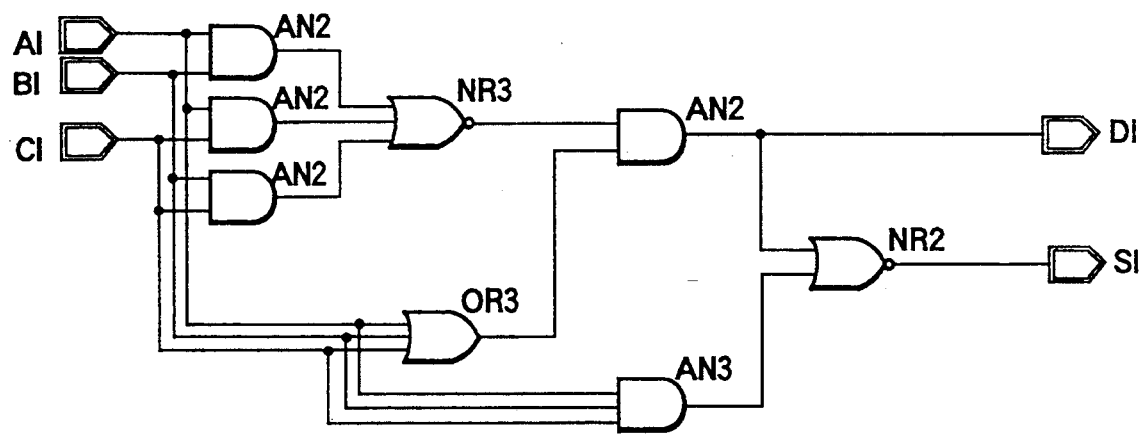
FIG. 4 is a circuit diagram used for explanation of the steps of the semiconductor integrated circuit fabrication method according to an embodiment of the present invention.

In the first step S1, a circuit diagram, which comprises many circuit elements for the LSI, is drawn by an engineering work station (EWS). FIG. 4 is an example of the circuit diagram drawn by the EWS.

In the second step S2, circuit description net statements are generated by using a generation program stored in the EWS. The circuit description net statements are wiring connection information by which cells as circuit elements corresponding to the circuit elements are connected.

FIG. 5 shows an example of the circuit description net statements generated from the circuit diagram shown in FIG. 4.

In the third step S3, standard cells are arranged and wired to one another based on the circuit description net statements by a router, which is a conventional automated wiring software tool.

The steps S1 to S3 described above are commonly used in a conventional standard cell design method.

In the fourth step S4, each of the standard cells obtained from the third step S3 is converted into a symbolic cell. This conversion can be easily performed because the standard cells and the symbolic cells are stored in a library and the symbolic cells are equivalent to conventional standard cells with a one-to-one correspondence. The symbolic cells are also converted to a stick diagram in the fourth step S4.

In the fifth step S5, the LSI a designer designates the dimensions of each transistor in the symbolic cells based on the type of the symbolic cell and allowable area for the transistor.

By the fourth and fifth steps S4 and S5, the cell areas are reduced to satisfactory cell areas by using a compactor, which is a computer-aided graphics system. In these steps, the dimensions of the transistor in the symbolic cell are changed into minimum possible dimensions by the compactor in consideration of the type of symbolic cell and the transistor area. Moreover, common patterns in a pair of adjacent symbolic cells are also overlapped to reduce the cell areas.

For example, the dimensions of the transistor designed by the design method according to the present invention is approximately ⅓ to ¼ of the area of the transistor designed by the standard cell design method.

In the sixth step S6, a mask pattern for the LSI is formed based on the satisfactory symbolic cell layout with the minimum cell areas.

Figure 6:
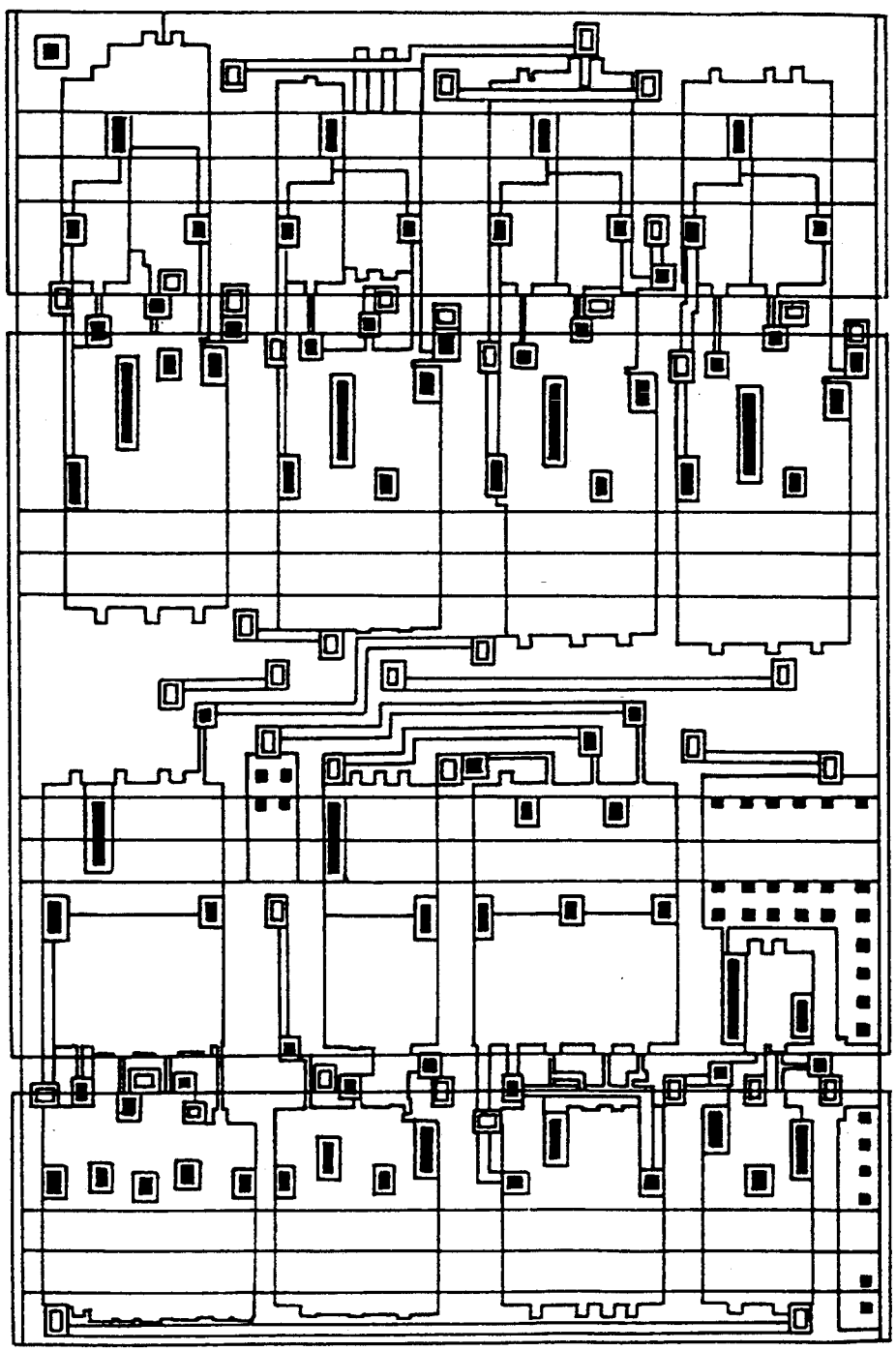
FIG. 6 is an original pattern layout before optimizing the area, which is generated by a conventional design method such as the standard cell design method.
Figure 7:
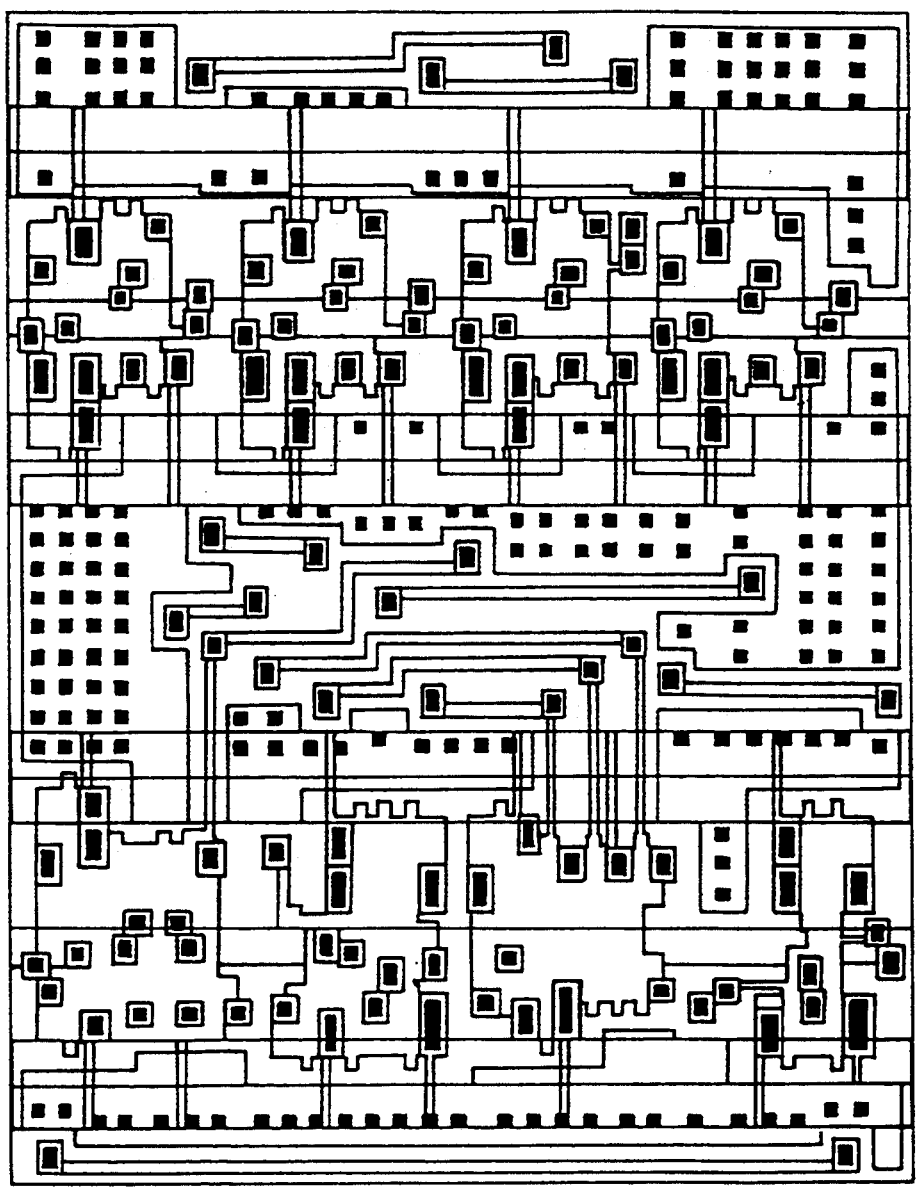
FIG. 7 is an optimum pattern layout after optimizing the area according to the present invention.

FIG. 6 is a pattern layout obtained by using a conventional standard cell design method. FIG. 7 is a pattern layout obtained by using the semiconductor integrated circuit fabrication method according to the present invention.

When the pattern layout shown in FIG. 7 is compared with the pattern layout shown in FIG. 6, the width of a P channel type MOS transistor in FIG. 6 is 85 microns and that in FIG. 7 is 30 microns. Further, the width of an N channel type MOS transistor in FIG. 6 is 62 microns. On the other hand, the width of the N channel type MOS transistor in FIG. 7 is 20 microns.

In a step S7 after the mask pattern forming step as a final step, an actual LSI is formed by using the mask pattern shown in FIG. 7 by a conventional LSI fabrication method.

Figure 8A:
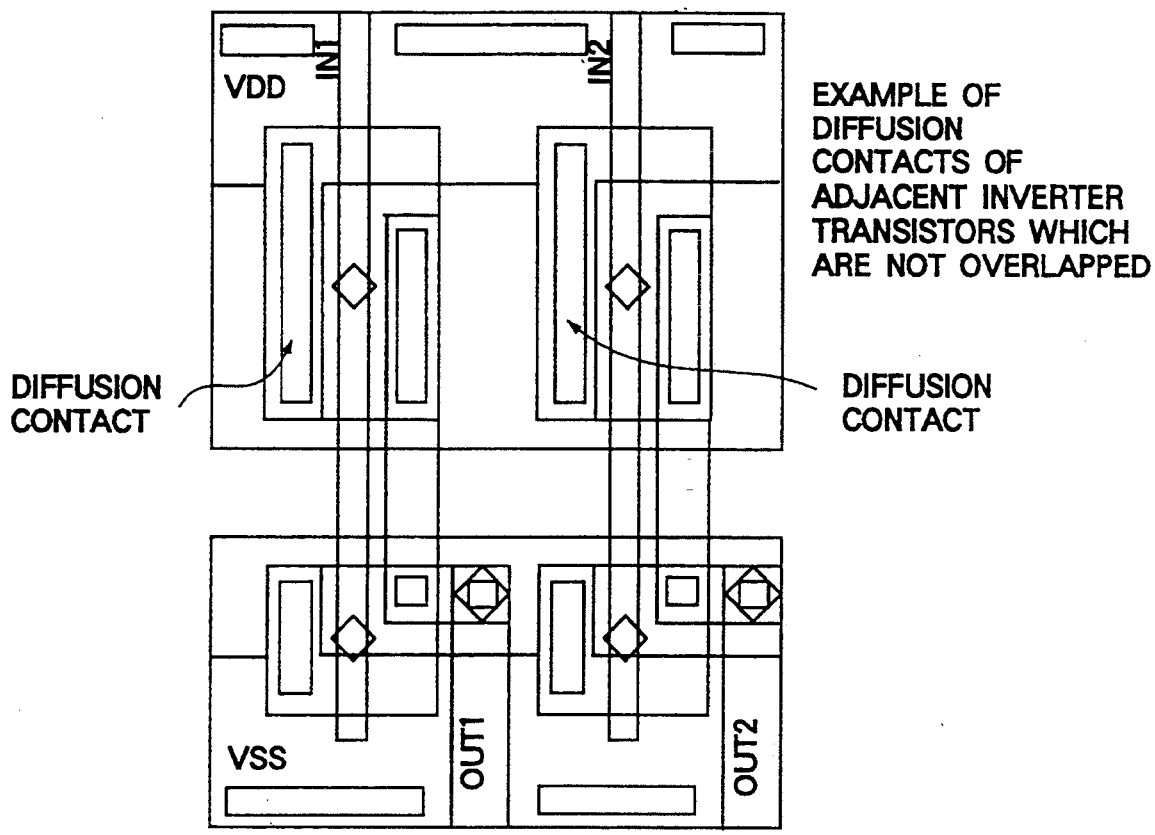
FIG. 8A is a pattern layout of an inverter transistor with no overlapped areas.
Figure 8B:
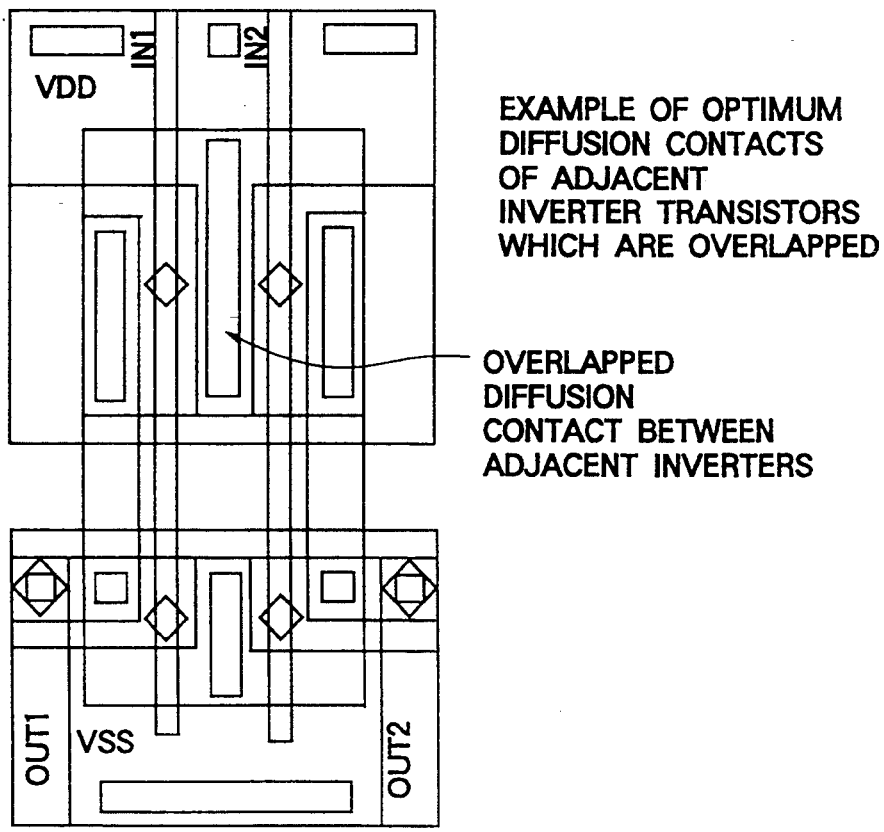
FIG. 8B is a pattern layout having an overlapped area as a common area for a diffusion contact of an inverter transistor.

Next, an illustrative example for the pattern having a common area that is overlapped in adjacent cells is explained referring to FIGS. 8A and 8B.

FIG. 8A is a pattern layout of two inverter transistors with no overlapped areas. On the other hand, FIG. 8B is a pattern layout of two inverter transistors with an overlapped area as a common area for diffusion contacts in the two inverter transistors. As clearly shown in FIG. 8B, the diffusion contacts in the adjacent inverter transistors are held in common to reduce the inverter transistor area.

As can be readily understood from the foregoing description, an LSI with the minimum area can be formed by the semiconductor integrated fabrication method.

Furthermore, the present invention in not limited to the embodiment described above. Various modifications will become possible for those skilled in the art after the teaching of the present disclosure without departing from the scope thereof.

What is claimed is:

1. A semiconductor integrated circuit fabrication method for designing and fabricating semiconductor circuit elements on a semiconductor substrate for a LSI circuit, comprising the steps of:

drawing a semiconductor circuit diagram by arranging standard cells for the semiconductor circuit elements and wiring among the standard cells by using a standard cell design method;

describing circuit description net statements based on the semiconductor circuit diagram;

arranging and wiring the standard cells to one another;

converting the standard cells into symbolic cells with a one-to-one correspondence to generate a symbolic cell layout;

generating a stick diagram in accordance with the symbolic cell layout;

changing the dimensions of each transistor in the symbolic cell, overlapping common areas of contact areas, vias among them, and wires between adjacent transistors in the symbolic cells, shortening the length of wire in a transistor, and changing a position of the contact area, the vias, and the wire of the transistor to obtain the minimum area for the transistor;

forming a mask pattern in accordance with the arranging and wiring of the symbolic cells obtained by the above steps; and forming the semiconductor circuit elements and wiring among the semiconductor circuit elements on the semiconductor substrate by using the mask pattern.

* * * * *